(12) United States Patent
Weinfurtner

(10) Patent No.: US 7,078,940 B2
(45) Date of Patent: Jul. 18, 2006

(54) CURRENT COMB GENERATOR

(75) Inventor: Guenter Weinfurtner, Wendelstein (DE)

(73) Assignee: Lucent Technologies Inc., Murray Hill, NJ (US)

( * ) Notice: Subject to any disclaimer, the term of this patent is extended or adjusted under 35 U.S.C. 154(b) by 8 days.

(21) Appl. No.: 10/857,949

(22) Filed: Jun. 2, 2004

(65) Prior Publication Data

US 2005/0270087 A1     Dec. 8, 2005

(51) Int. Cl.
*H03C 3/00*     (2006.01)

(52) U.S. Cl. ...................... 327/101; 327/119

(58) Field of Classification Search ................ 327/101, 327/105, 119, 120, 121, 122
See application file for complete search history.

(56) References Cited

U.S. PATENT DOCUMENTS

| | | | | |
|---|---|---|---|---|
| 3,777,253 A | * | 12/1973 | Callan | 323/284 |
| 4,967,160 A | * | 10/1990 | Quievy et al. | 327/116 |
| 5,184,082 A | * | 2/1993 | Nelson | 324/537 |
| 5,343,168 A | * | 8/1994 | Guthrie | 331/16 |
| 5,548,603 A | * | 8/1996 | Calvani et al. | 372/25 |
| 5,594,458 A | | 1/1997 | Garn et al. | |
| 5,929,663 A | * | 7/1999 | Dougherty | 327/101 |
| 6,140,866 A | * | 10/2000 | Wang | 327/552 |
| 6,169,391 B1 | * | 1/2001 | Lei | 323/266 |
| 6,300,723 B1 | * | 10/2001 | Wang et al. | 315/247 |
| 6,373,735 B1 | * | 4/2002 | Usui | 363/89 |
| 6,570,458 B1 | | 5/2003 | Cuddy | |
| 6,690,247 B1 | * | 2/2004 | Kintis et al. | 333/20 |
| 6,792,119 B1 | * | 9/2004 | Aarts | 381/98 |

* cited by examiner

*Primary Examiner*—Jeffrey Zweizig

(57) ABSTRACT

The current comb generator periodically applies current spikes to a power supply signal in the time domain to produce a series of current spikes at different frequencies in the frequency domain.

24 Claims, 5 Drawing Sheets

CURRENT COMB GENERATOR

BACKGROUND OF THE INVENTION

Various standards exist with respect to supplying power around the world. For example, in the United States the power supply standard requires a power supply signal of 110 Volts alternating current at a frequency of 60 Hz and in Europe the power supply standard requires a power supply signal of 220 Volts alternating current at 50 Hz. Standards also exist in various countries, etc. For equipment that will be connected to the power supply or mains, the harmonics of the power supply current that will be produced by such equipment have to meet requirements, for example, the standard IEC 61000-3-2.

To insure that the power supply signal meets these harmonics requirements, EMC (electro magnetic compatibility) measurements are taken. The equipment used to make these measurements has to be calibrated, for example, every year. However, methods for determining whether the test equipment is properly calibrated and produces the correct results (referred to as determining the plausibility) are difficult to perform, and thus, not performed very often.

SUMMARY OF THE INVENTION

The present invention provides a current comb generator. The current comb generator generates a series of current pulses at different frequencies in the power supply current. Unlike conventional, voltage comb generators, the current comb generator does not affect the voltage of the power supply, only the current.

In one exemplary embodiment, the current comb generator includes a rectifier rectifying a received power supply signal. As a result, the negative voltage portion of the sinusoidal power supply signal becomes positive. Because the power supply signal has a sinusoidal waveform, the rectified power supply voltage has a voltage that changes over time. A voltage detector in the comb generator detects when the voltage of the rectified power supply signal is at a particular voltage level. In response to this detection, the voltage detector causes a switch in the comb generator to close for a brief period of time. Closing the switch causes a load to become connected to the power supply signal. This results in a current spike in the power supply signal in the time domain. Because the power supply signal is sinusoidal, these current spikes are generated on a periodic basis. The periodic current spikes in the time domain result in a series of current spikes at different frequencies in the power supply signal in the frequency domain.

In another exemplary embodiment, an angle detector replaces the voltage detector of the previous embodiment. The angle detector detects when the rectified sinusoidal power supply signal reaches a certain angle, and causes the switch in the comb generator to close for a brief period of time when the angle is detected. This produces a current spike in the power supply signal in the time domain. Because the power supply signal is sinusoidal, these current spikes are generated on a periodic basis. The periodic current spikes in the time domain result in a series of current spikes at different frequencies in the power supply signal in the frequency domain.

As will be appreciated from the above discussion, a rectified power supply signal is not essential to the operation of the invention. Instead an un-rectified power supply signal may be used. In this case, the voltage detector detects two voltages having only a difference in polarity, and the angle detector detects two angles differing by 180 degrees.

As will be further appreciated, the detector in the present invention detects a periodically occurring characteristic of the power supply signal such as voltage or angle. Accordingly, depending on the nature of the power supply signal the detector may be structured to detect other periodic characteristics of the power supply signal.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EMBODIMENTS

Figure 1:
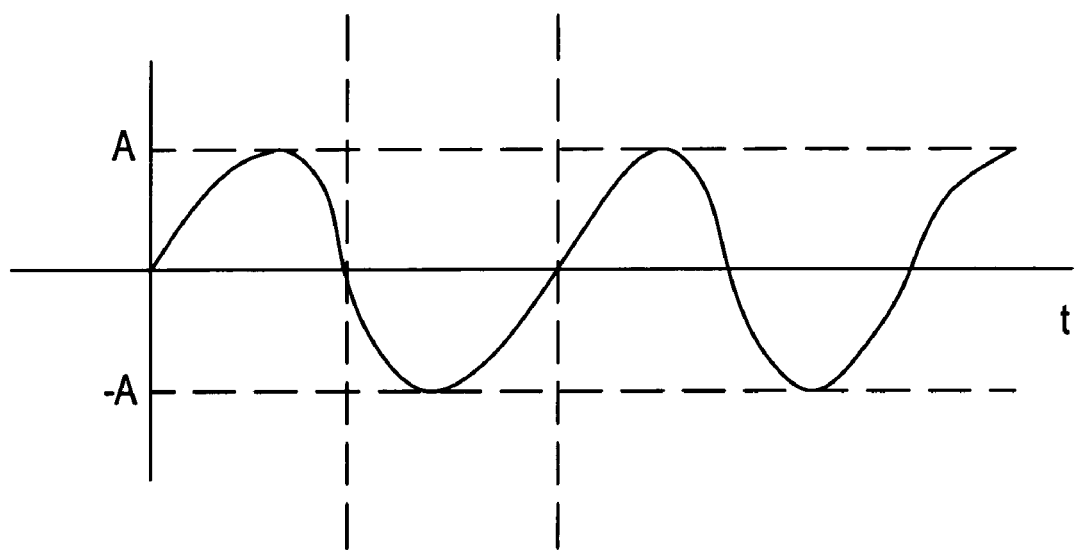
FIG. 1 illustrates an example of a power supply signal.

FIG. 1 illustrates an example of a power supply signal. As shown, the power supply signal is a sinusoidal signal that may be expressed according to the following equation:

$$u(t)=A*\sin(\omega*t) \quad (1)$$

where A is the amplitude, W is the angle ($2*\pi*f$), and t is time (note $\pi=3.14\ldots$, and f=frequency).

Figure 2:
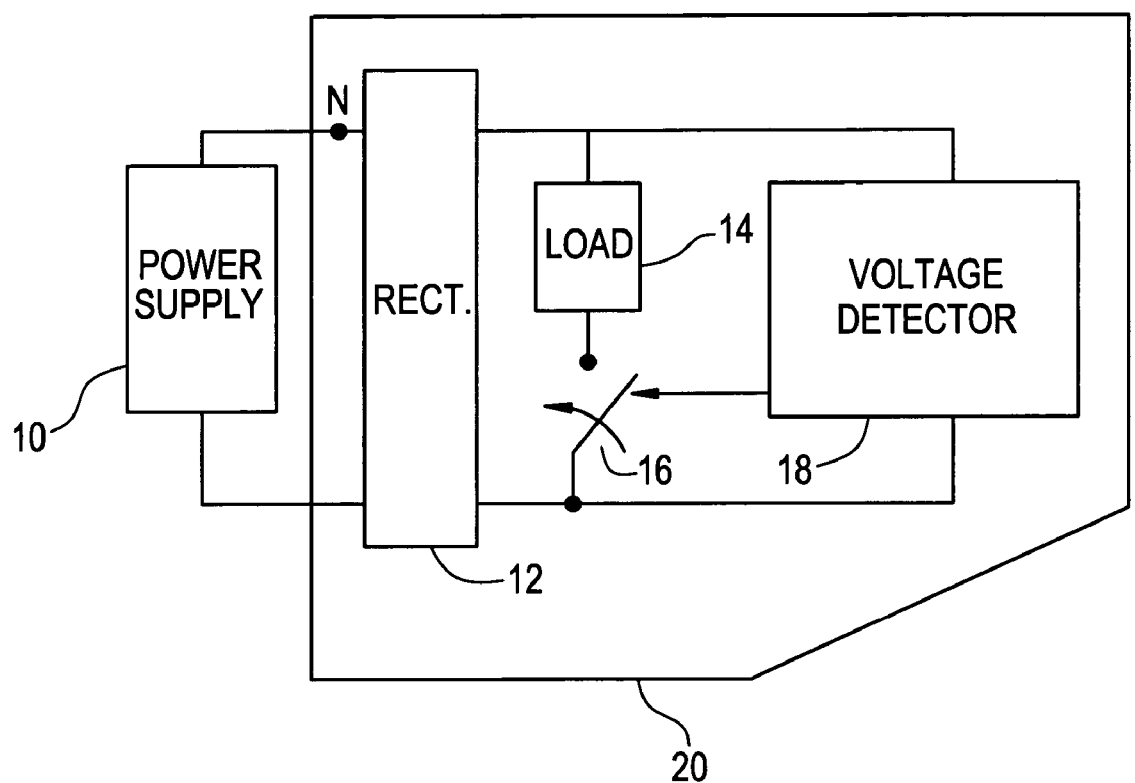
FIG. 2 illustrates a first example embodiment of a current comb generator according to the present invention.

FIG. 2 illustrates a first example embodiment of a current comb generator according to the present invention. As shown, the current comb generator 20 is connected to a power supply 10 (e.g., the public mains), which produces a power supply signal as shown in FIG. 1.

Figure 3:
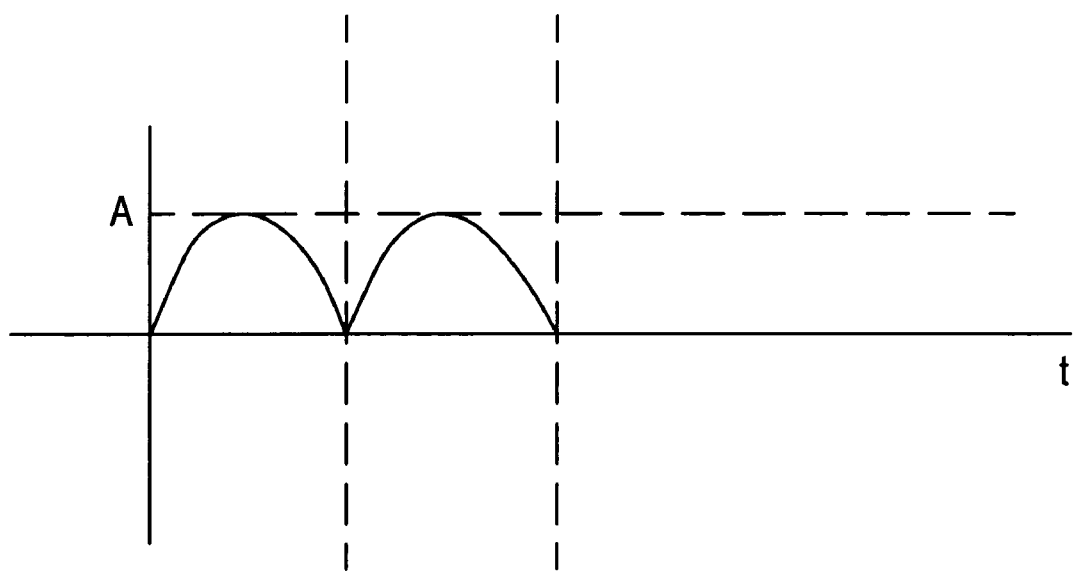
FIG. 3 illustrates an example of the rectified power supply signal when the power supply signal is as shown in FIG. 1.

The current comb generator 20 includes a rectifier 12 that rectifies the power supply signal. FIG. 3 illustrates an example of the rectified power supply signal when the power supply signal is as shown in FIG. 1.

Returning to FIG. 2, a voltage detector 18 of the comb generator 20 detects the voltage of the rectified power supply signal. When the voltage detector 18 detect a particular voltage (e.g., 110 Volts when the maximum amplitude A of the power supply signal is 110 Volts), the voltage detector 18 closes a switch 16 in the comb generator 20 for a brief period of time. The switch 16 may be a transistor (bipolar or MOSFET), a thyristor, GTO (gate turn-off thyristor), etc. The switch 16 may further include resistive and capacitive elements in association therewith that control the period of time that the switch 16 remains closed (FIG. 4 discussed in detail below illustrates this example). In one embodiment, the period of time is less than 2% of the period of the mains frequency. For example, if the frequency of the power supply mains is 50 Hz, the period of time is 20 ms and the current peak is about 0.2 ms at the half peak value. As shown in FIG. 2, the switch 16 connects a load 14 to the rectified power supply signal for the brief period of time that the switch is closed. The load 14 may be a resistor, for example.

Figure 4:
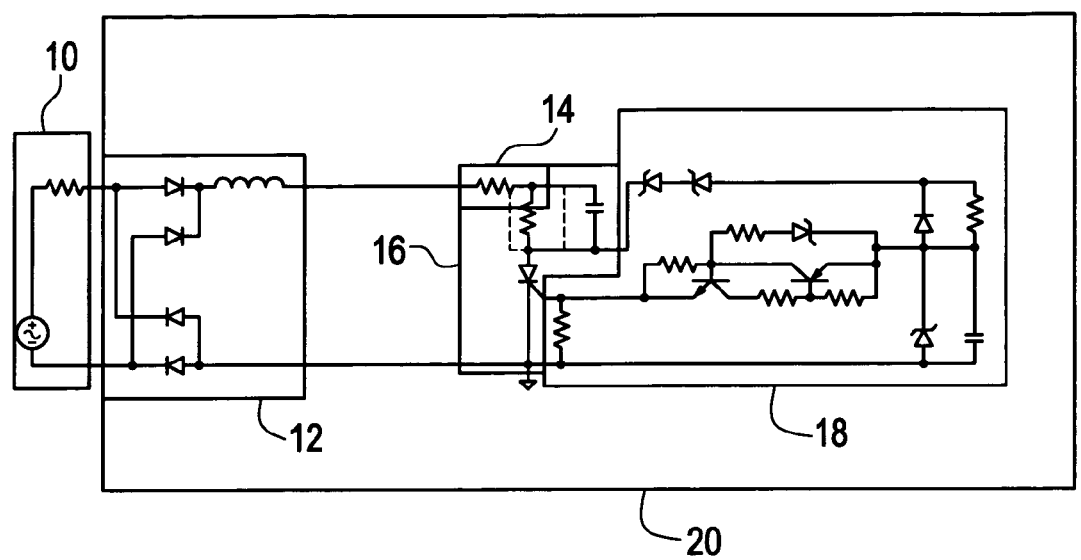
FIG. 4 illustrates a circuit level diagram of one possible circuit level structure for the embodiment of FIG. 2.

FIG. 4 illustrates a circuit level diagram of one possible circuit level structure for the embodiment of FIG. 2 discussed above. As will be appreciated, this is but one of the numerous possible circuit structures for the embodiment of FIG. 2

Figure 5:
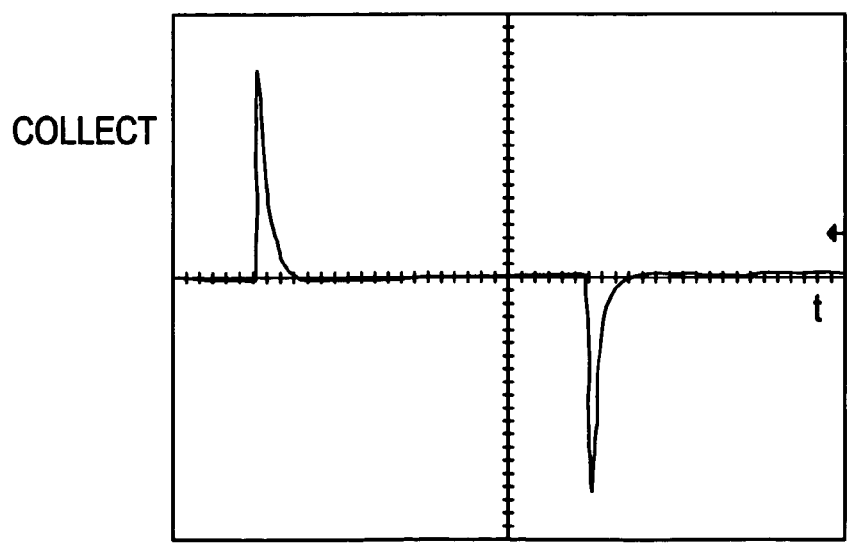
FIG. 5 illustrates current with respect to time at node N in FIG. 2.

Placing the load 14 in connection with the power supply signal causes a current spike. Because, as shown in FIG. 3 the rectified power supply signal is periodic, the current spikes are also generated periodically. FIG. 5 illustrates current with respect to time at node N in FIG. 2. As shown, node N is prior to the rectifier 12. As a result, a periodic positive and negative current spike are generated. It should be noted that only one positive and one negative spike will generated. As evident from FIG. 4, the turn-on pulse of the thyristor discharges the capacitor.

Figure 6:
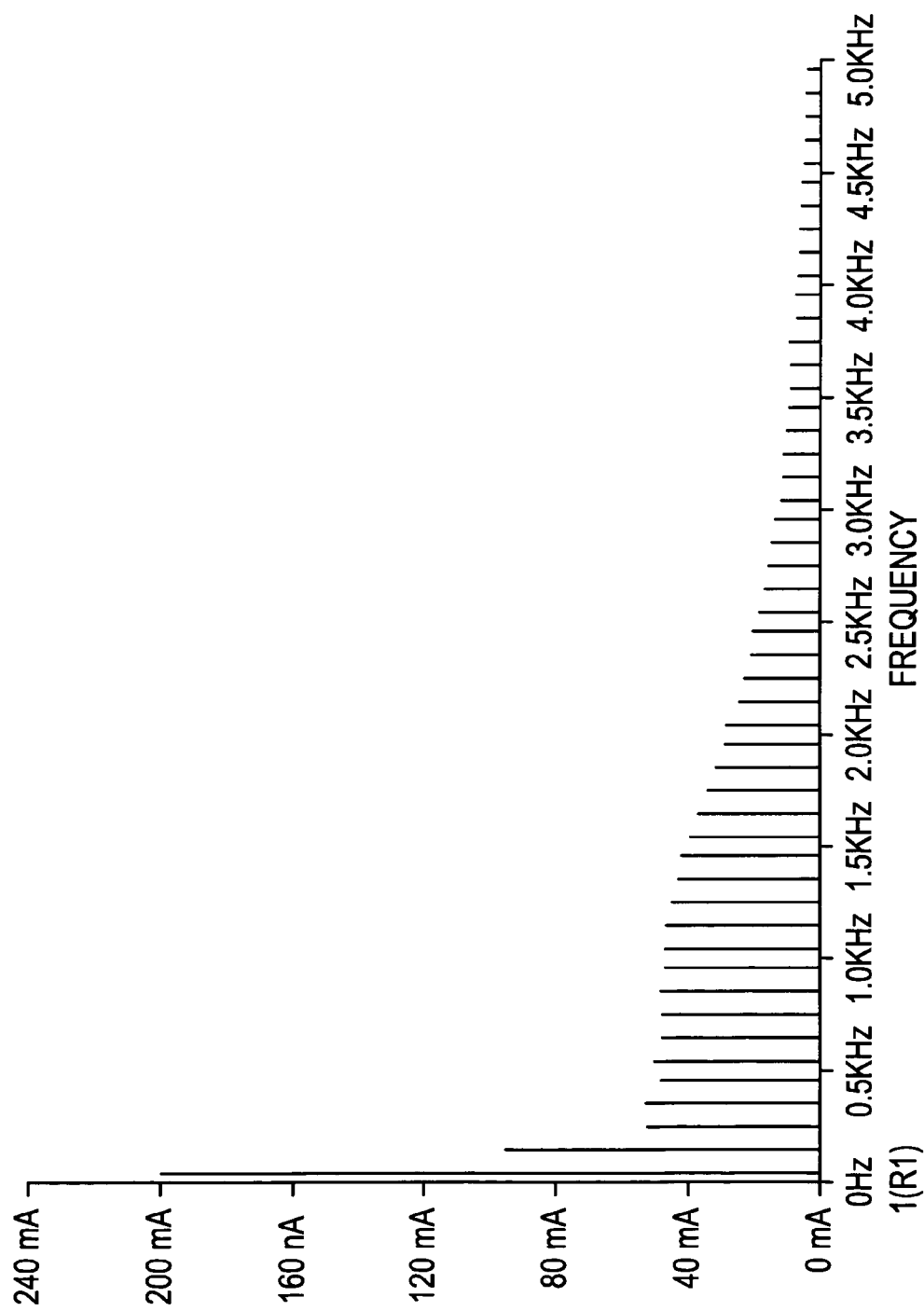
FIG. 6 illustrates the current in the frequency domain at node N.

FIG. 6 illustrates the current in the frequency domain at node N. As shown a plurality of current spikes are produced at different frequencies. More specifically, the current spikes are generated at a periodic frequency interval with decreasing magnitude. Hence, the current comb generator 20 produces the classic comb generator output, but does so for current in the frequency domain. This current comb generator output provides a basis from which, for example, harmonic testing equipment may be calibrated and tested for plausibility.

Figure 7:
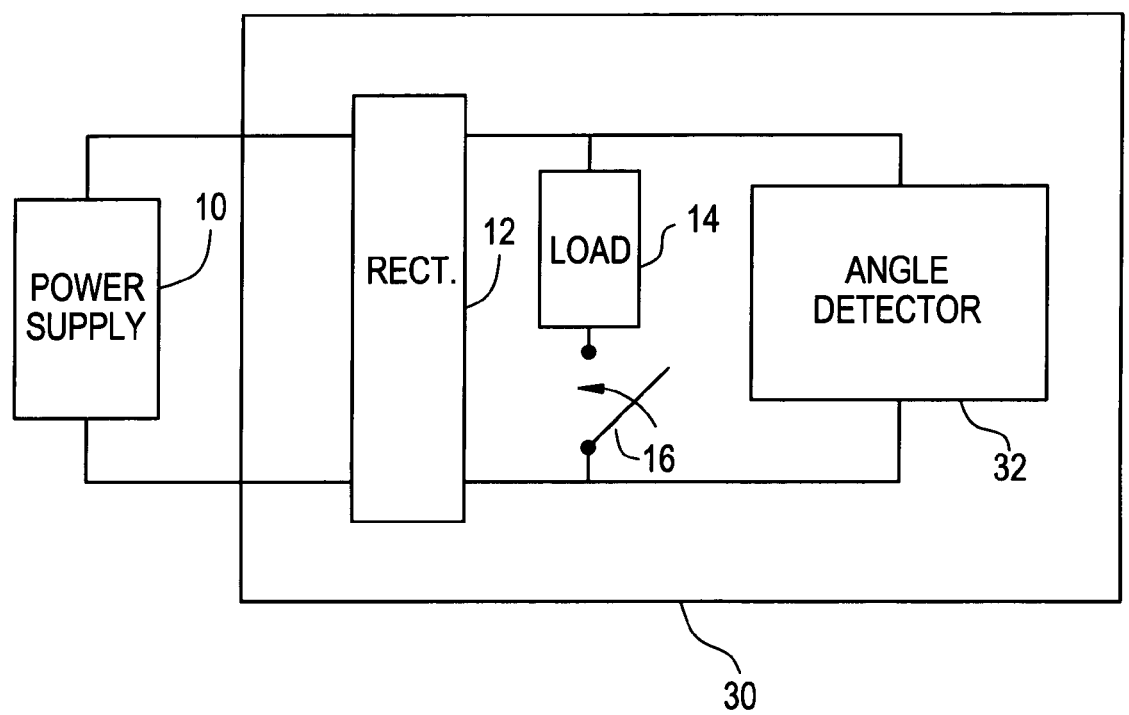
FIG. 7 illustrates a second embodiment of a current comb generator according to the present invention.

FIG. 7 illustrates a second embodiment of a current comb generator according to the present invention. As shown, the current comb generator 30 of FIG. 7 has the same structure as the current comb generator 20 of FIG. 2, except that the voltage detector 18 has been replaced by an angle detector 32. The angle detector 32 detects when the rectified power supply signal is at a particular angle (e.g., 90 degrees), and causes the switch 16 to close for a brief period of time when the angle is detected. Current spikes in the time domain and frequency domain are thus generated as shown in FIGS. 5 and 6, respectively.

As will be appreciated from the above discussion, a rectified power supply signal is not essential to the operation of the invention. Instead an un-rectified power supply signal may be used. In this case, the voltage detector detects two voltages having only a difference in polarity, and the angle detector detect two angles differing by 180 degrees.

As will be further appreciated, the detector in the present invention detects a periodically occurring characteristic of the power supply signal such as voltage or angle. Accordingly, depending on the nature of the power supply signal the detector may be structured to detect other periodic characteristics of the power supply signal.

The invention being thus described, it will be obvious that the same may be varied in many ways. Such variations are not to be regarded as a departure from the invention, and all such modifications are intended to be included within the scope of the invention.

I claim:

1. A current comb generator, comprising:
   a load;
   a voltage detector configured to detect if a power supply signal is at a particular voltage; and
   a switch configured to connect the load to the power supply signal and then disconnect the load from the power supply signal in response to the voltage detector detecting that the power supply voltage is at a particular voltage.

2. The current comb generator of claim 1, wherein the switch is configured such that the load is connected to the power supply signal for less than 2% of the period of the power supply signal in response to the voltage detector detecting that the power supply voltage is at a particular voltage.

3. The current comb generator of claim 1, wherein if the power supply signal is a periodic signal, an operation of the switch causes two current spikes in a time domain for each period of the power supply signal.

4. The current comb generator of claim 1, further comprising:
   a rectifier configured to rectify the power supply signal; and wherein
   the voltage detector is configured to detect if the rectified power supply signal is at the particular voltage.

5. The current comb generator of claim 1, wherein the load is a resistor.

6. The current comb generator of claim 1, wherein the switch includes one of a transistor, thyristor, and gate turn-off thyristor.

7. The current comb generator of claim 1, wherein the switch includes at least one resistive element and at least one capacitive element cooperatively controlling a length of time the switch connects the load to the power supply signal.

8. A current comb generator, comprising:
   a load;
   an angle detector configured to detect if the power supply signal is at a particular angle; and
   a switch configured to selectively connect the load to a power supply signal for a period of time if the angle detector detects that the power supply signal is at the particular angle.

9. The current comb generator of claim 8, wherein the switch is configured to connect the load to the power supply signal and then disconnect the load from the power supply signal in response to the angle detector detecting that the power supply voltage is at the particular angle.

10. The current comb generator of claim 8, wherein the switch is configured such that the load is connected to the power supply signal for less than 2% of the period of the power supply signal in response to the angle detector detecting that the power supply voltage is at the particular angle.

11. The current comb generator of claim 8, wherein if the power supply signal is a periodic signal, an operation of the switch causes two current spikes in a time domain for each period of the power supply signal.

12. The current comb generator of claim 8, further comprising:
   a rectifier configured to rectify the power supply signal; and wherein
   the angle detector is configured to detect if the rectified power supply signal is at the particular angle.

13. The current comb generator of claim 8, wherein the load is a resistor.

14. The current comb generator of claim 8, wherein the switch includes one of a transistor, thyristor, and gate turn-off thyristor.

15. The current comb generator of claim 8, wherein the switch includes at least one resistive element and at least one capacitive element cooperatively controlling the period of time the switch connects the load to the power supply signal.

16. A method of generating a current comb signal, comprising:
   detecting if a power supply signal is at a particular voltage; and connecting a load to the power supply signal and then disconnecting the load from the power supply signal in response to the detecting step detecting that the power supply voltage is at the particular voltage.

17. The method of claim 16, wherein the connecting step connects the load to the power supply signal for less than 2% of the period of the power supply signal in response to the detecting step detecting that the power supply voltage is at the particular voltage.

18. The method of claim 16, wherein if the power supply signal is a periodic signal, the connecting step causes two current spikes in a time domain for each period of the power supply signal.

19. The method of claim 16, further comprising:
rectifying the power supply signal; and wherein
the detecting step detects if the rectified power supply signal is at the particular voltage.

20. A method of generating a current comb signal, comprising:
detecting if a power supply signal is at a particular angle;
selectively connecting the load to the power supply signal for a period of time if the detecting step detects that the power supply signal is at the particular angle.

21. The method of claim 20, wherein the connecting step connects the load to the power supply signal and then disconnects the load from the power supply signal in response to the angle detector detecting that the power supply voltage is at the particular angle.

22. The method of claim 20, wherein the connecting step connects the load to the power supply signal for less than 2% of the period of the power supply signal in response to the detecting step detecting that the power supply voltage is at the particular angle.

23. The method of claim 20, wherein if the power supply signal is a periodic signal, the connecting step causes two current spikes in a time domain for each period of the power supply signal.

24. The method of claim 20, further comprising:
rectifying the power supply signal; and wherein
the detecting step detects if the rectified power supply signal is at the particular angle.

* * * * *